(12) United States Patent
Plenio et al.

(10) Patent No.: US 11,181,494 B2
(45) Date of Patent: Nov. 23, 2021

(54) METHOD AND DEVICE FOR GENERATING A NUCLEAR MAGNETIC RESONANCE SPECTRUM OF NUCLEAR SPIN MOMENTS OF A SAMPLE

(71) Applicants: Martin Bodo Plenio, Ulm (DE); Ilai Schwartz, Blaustein (DE); Liam McGuinness, Ulm (DE); Joachim Rosskopf, Neu-Ulm (DE)

(72) Inventors: Martin Bodo Plenio, Ulm (DE); Ilai Schwartz, Blaustein (DE); Liam McGuinness, Ulm (DE); Joachim Rosskopf, Neu-Ulm (DE)

(*) Notice: Subject to any disclaimer, the term of this patent is extended or adjusted under 35 U.S.C. 154(b) by 18 days.

(21) Appl. No.: 16/618,573

(22) PCT Filed: Jun. 1, 2018

(86) PCT No.: PCT/EP2018/064481
§ 371 (c)(1),
(2) Date: Dec. 2, 2019

(87) PCT Pub. No.: WO2018/220183
PCT Pub. Date: Dec. 6, 2018

(65) Prior Publication Data
US 2020/0158669 A1    May 21, 2020

(30) Foreign Application Priority Data

Jun. 2, 2017 (DE) .................... 10 2017 209 453.2
Jun. 20, 2017 (DE) .................... 10 2017 210 309.4

(51) Int. Cl.
*G01N 24/10*    (2006.01)
*G01N 24/08*    (2006.01)
(Continued)

(52) U.S. Cl.
CPC .............. *G01N 24/10* (2013.01); *G01N 24/08* (2013.01); *G01R 33/282* (2013.01); *G01R 33/448* (2013.01); *G01R 33/4608* (2013.01)

(58) Field of Classification Search
CPC ...... G01N 24/10; G01N 24/08; G01R 33/282; G01R 33/448; G01R 33/4608
See application file for complete search history.

(56) References Cited

U.S. PATENT DOCUMENTS 5,677,628 A * 10/1997 Watanabe .......... G01R 33/4833
                                                    324/307
5,894,221 A *  4/1999 Watanabe .......... G01R 33/4833
                                                    324/307
(Continued)

FOREIGN PATENT DOCUMENTS

WO    WO-2016/188557 A1    12/2016
WO    WO-2017/011393 A1    1/2017

OTHER PUBLICATIONS

Staudacher, T., et al., "Nuclear Magnetic Resonance Spectroscopy on a (5-Nanometer)³ Sample Volume," Science vol. 339 Feb. 1, 2013, (pp. 561-563).

(Continued)

*Primary Examiner* — Dixomara Vargas
(74) *Attorney, Agent, or Firm* — Laura W. Smalley

(57) ABSTRACT

A method for generating a nuclear magnetic resonance spectrum of nuclear spin moments of a sample includes a static magnetic field permeating the sample, and a detection spin moment with a detection region surrounding the latter. The detection region extends at least partly into the sample. The method also includes an antenna element for radiating in frequency pulses for influencing the nuclear spin moments and radio-frequency pulses for influencing the detection spin moment, where a polarization step involves polarizing at least one portion of the nuclear spin moments (Continued)

along the magnetic field to form a longitudinal magnetization, where a transfer step involves converting the longitudinal magnetization ($M_x$) into a transverse magnetization ($M_{xy}$) by radiating in a frequency pulse (F) with a 90° flip angle, wherein a detection step involves radiating in a sequence of radio-frequency pulses onto the detection spin moment and subsequently detecting a signal (32') of the transverse magnetization ($M_{xy}$) present in the detection region and storing the signal as detection result in a list. The detection step is carried out a number of times repeatedly in succession, wherein the polarization step and the transfer step and also the detection steps are carried out.

19 Claims, 5 Drawing Sheets

(51) Int. Cl.
*G01R 33/28* (2006.01)
*G01R 33/44* (2006.01)
*G01R 33/46* (2006.01)

(56) References Cited

U.S. PATENT DOCUMENTS

| | | | | |
|---|---|---|---|---|
| 6,005,390 | A * | 12/1999 | Watanabe | G01R 33/4833 |
| | | | | 324/307 |
| 6,229,308 | B1 * | 5/2001 | Freedman | G01V 3/32 |
| | | | | 324/303 |
| 9,810,758 | B2 * | 11/2017 | Sidles | G01R 33/383 |
| 10,114,095 | B2 * | 10/2018 | Jara | G01R 33/50 |
| 10,241,178 | B2 * | 3/2019 | Brady-Kalnay | G01R 33/5614 |
| 2006/0043970 | A1 * | 3/2006 | Zaharchuk | G01R 33/563 |
| | | | | 324/307 |
| 2014/0035584 | A1 | 2/2014 | Twitchen et al. | |
| 2014/0218021 | A1 * | 8/2014 | Koehler | G01R 33/246 |
| | | | | 324/301 |
| 2014/0266195 | A1 * | 9/2014 | Levin | G01R 33/56509 |
| | | | | 324/309 |
| 2016/0054402 | A1 | 2/2016 | Merlies | |
| 2016/0291109 | A1 * | 10/2016 | Jara | G01R 33/5617 |
| 2016/0349339 | A1 * | 12/2016 | Brady-Kalnay | G01R 33/5614 |
| 2019/0346527 | A1 * | 11/2019 | Schwartz | G01N 24/12 |

OTHER PUBLICATIONS

King, Jonathan P., et al., "Room-temperature in situ nuclear spin hyperpolarization from optically pumped nitrogen vacancy centres in diamond," Nature Communications 6:8965, Dec. 7, 2015, (pp. 1-5).
Schmitt, et al., "Submillihertz magnetic spectroscopy performed with a nanoscale quantum sensor," Science 356 (2017) (pp. 832-837).
Shi, Fazhan, et al., Single-protein spin resonance spectroscopy under ambient conditions, Science vol. 347, Mar. 6, 2015, Issue 6226 (pp. 1135-1138).
PCT International Search Report and Written Opinion of the International Searching Authority of PCT/EP2018/064481 dated Sep. 10, 2018 (12 pgs).
International Preliminary Report on Patentability Chapter I of the PCT dated Dec. 3, 2019 for International Application No. PCT/EP2018/064481 (9 pgs).

* cited by examiner

METHOD AND DEVICE FOR GENERATING A NUCLEAR MAGNETIC RESONANCE SPECTRUM OF NUCLEAR SPIN MOMENTS OF A SAMPLE

CROSS-REFERENCE TO RELATED APPLICATIONS

This application is a national phase application of International Application No. PCT/EP2018/064481, filed Jun. 1, 2018, which claims the benefit of German Application No. DE 102017210309.4, filed Jun. 20, 2017 and German Application No. DE 102017209453.2, filed Jun. 2, 2017, all of which are incorporated herein by reference.

BACKGROUND OF THE INVENTION

Field of the Invention

The invention relates to a method for generating a nuclear magnetic resonance spectrum of nuclear spin moments of a sample, comprising a static magnetic field permeating the sample, and a detection spin moment with a detection region surrounding the latter, said detection region extending at least partly into the sample, and also an antenna element for radiating in frequency pulses for influencing the nuclear spin moments and radio-frequency pulses for influencing the detection spin moment. The invention furthermore relates to a device for carrying out the method.

Description of Related Art

Magnetic detection and imaging devices are important tools in biological and material sciences applications. In particular methods for detecting nuclear magnetic resonance (NMR) have high spectral resolutions of the nuclear magnetic resonance spectra generated. To that end, the nuclear spin moments of a (material) sample are exposed to a strong static magnetic field, as a result of which the nuclear spin moments are excited to effect a precessing movement, so-called Larmor precession. In this case, the precession or Larmor frequency is specific to the respective chemical nuclear spin species, and is influenced by the chemical and spatial environment of a respective nuclear spin moment. By detecting and evaluating the nuclear magnetic resonance spectra of the Larmor frequencies that occur, it is thus possible to determine very accurately the chemical composition and the spatial construction of the sample or structures contained therein, such as molecules, for example.

Inductive methods are often used for detecting nuclear magnetic resonance signals. To that end, an induction coil extending around the sample is used, for example, wherein the precessing nuclear spin moments generate alternating magnetic fields that induce an electrical voltage as nuclear magnetic resonance signal in the turns of the induction coil.

Such inductive methods for generating nuclear magnetic resonance spectra are suitable in particular for detecting a large magnetic moment (magnetization), such as is generated in particular by a large number of nuclear spin moments aligned (polarized) in the same way. The induced voltage, that is to say the nuclear magnetic resonance signal, is proportional to the change over time in a magnetic flux permeating the induction coil. In this case, the magnetic flux is substantially proportional to the number of magnetic flux lines which pass through the interior of the induction coil. If the diameter of the induction coil is reduced, the number of flux lines passing through and hence the amplitude of the induced voltage are reduced. In this case, the minimum diameter of the induction coil is restricted to a few micrometers (pm) in order to avoid self-induction effects. As a result, the spatial resolution of such inductive methods is restricted to comparatively large samples, as a result of which the spatial resolution in a nuclear magnetic resonance examination is disadvantageously limited.

In order to improve the spatial resolution for generating nuclear magnetic resonance spectra it is possible, for example, to use individual detection spin moments as local magnetic field sensors having a high spatial resolution. In this case, by way of example, individual electron spin moments are used as detection spin moments. In this case, the detection spin moments have a detection region or a detection volume. A detection region in this case should be understood to mean, in particular, a spatial interaction region which permeates the sample and in which nuclear spin moments present bring about a sufficient influencing of the detection spin moment by means of dipolar interactions, said influencing being detectable or measurable. Since the interaction strength of the dipolar interactions scales with the inverse cubic distance ($r^3$), small detection regions of a few cubic nanometres ($nm^3$) and hence high spatial resolutions can be realized.

Staudacher, T., et al., "Nuclear Magnetic Resonance Spectroscopy on a (5-Nanometer)$^3$ Sample Volume" (Science 339(6119), 2013, 561-563) describes the generation of nuclear magnetic resonance spectra of nuclear spin moments in liquid and solid samples in a detection region (5 nm)$^3$ in size. This is done using electron spin moments of a nitrogen-vacancy centre (NV centre) in a diamond as detection spin moments. In this case, the detection spin moments are arranged near the diamond surface, such that the detection region extends into the sample. In order to improve a relaxation time of the detection spin moments and the spectral resolution, the detection spin moments are manipulated by means of a sequence of radio-frequency pulses. In this case, the detected nuclear magnetic resonance signal is brought about by a statistical polarization of the nuclear spin moments of the sample, that is to say a random net alignment or magnetization of the nuclear spin moments in the detection region. The nuclear magnetic resonance spectra generated have comparatively low spectral (frequency) resolutions with line widths in the kilohertz range (kHz). In this case, the spectral resolution is substantially limited by the comparatively low relaxation time of the detection spin moments.

The article Schmitt, S., et al., "Submillihertz magnetic spectroscopy performed with a nanoscale quantum sensor" (Science 356 (6340), 2017, 832-837) describes a method for generating a nuclear magnetic resonance spectrum of nuclear spin moments of a sample by means of detection spin moments, wherein the spectral resolution is not limited by the relaxation time of the detection spin moments. For this purpose, a so-called quantum heterodyne (Qdyne) method is used, wherein a detection signal of the detection spin moment is mixed or synchronized with an (external) local oscillator. In this case, the spectral resolution of the nuclear magnetic resonance spectrum is limited by the stability of the oscillator, such that high-resolution nuclear magnetic resonance spectra of the sample are made possible.

In order to carry out the Qdyne method, a sequence of radio-frequency pulses is radiated onto the detection spin moment. Afterwards, a signal of the magnetization that occurs in the detection region is detected and stored as detection result in a list. The detection is continuously repeated during a long measurement time (>1000 s) such that a long list of detection results is generated. The list is subsequently evaluated for example by means of autocorrelation of the detection results and subsequently Fourier-transformed in order to generate the nuclear magnetic resonance spectrum. In this case, the occurring magnetization of the nuclear spin moments of the sample is generated by the statistical polarization.

The sequence impresses on the detection spin moment a phase that is dependent on the initial state of the (statistical) magnetization. In this case, the sequence substantially acts only as a frequency filter with which the sensitivity of the detection spin moment is set to the frequency range of the Larmor frequencies of the nuclear spin moments. The phase is detected as a detection result, for example as a number of photons emitted by the detection spin moment by means of a photon detector, is stored in the list and synchronized with the external local oscillator before the sequence is performed anew. When the sequences are carried out in a repeated manner, the temporal variation of the phase impressed by the detection spin moment is thus detected, thus yielding the dynamic range of the magnetization and hence the nuclear magnetic resonance spectrum. In other words, the change over time in the statistical magnetization is determined during the measurement time.

The spectral resolution of the Qdyne method is substantially only limited by the stability of the local oscillator, as a result of which nuclear magnetic resonance spectra with millihertz (mHz) or microhertz (p Hz) frequency resolution or line width in conjunction with spatial resolution in the nanometres range are made possible.

In the case of nuclear spin moments in liquid samples, however, the spectral resolution is limited on account of the finite dimensions of the detection region. As a result of the molecular diffusion, in particular of the translational and rotational diffusion, of the nuclear spin moments in liquid samples, the dipolar interactions of the nuclear spin moments among one another, or nuclear spin moments of different molecules within the sample, are effectively reduced, as a result of which narrower nuclear magnetic resonance spectra with higher resolution are made possible.

In this case, however, the problem simultaneously occurs that, in particular on account of the translational diffusion, nuclear spin moments or molecules diffuse out of the detection region during the measurement time and new nuclear spin moments diffuse into the detection region. As a result, the phase and/or amplitude of the statistical magnetization are/is altered, and the detection results are thus influenced, as a result of which the line widths of the nuclear magnetic resonance spectrum generated are widened, such that the spectral resolution is disadvantageously reduced.

The average time duration after which such a random signal change in the statistical magnetization occurs is referred to as the correlation time. In this case, the correlation time (~μs) is generally significantly shorter than the measurement time (1000 s). The faster the diffusion within the sample, the smaller becomes the amplitude of the detection results in the Qdyne method. Consequently, application of the known Qdyne method is restricted to solid samples and liquid samples having very slow molecular diffusion.

BRIEF SUMMARY OF THE INVENTION

The invention is based on the object of specifying a particularly suitable method for generating a nuclear magnetic resonance spectrum of nuclear spin moments of a sample. The method is intended to be suitable, in particular, for generating nuclear magnetic resonance spectra with high spectral resolution in a nanoscopic detection region, even in the case of diffusing nuclear spin moments. The invention is furthermore based on the object of specifying a device for carrying out the method.

The object is achieved according to the invention by means of the features of claim 1 with regard to the method and by means of the features of claim 10 with regard to the device. The respective dependent claims relate to advantageous configurations and developments.

The method according to the invention is suitable and configured for generating a nuclear magnetic resonance spectrum of nuclear spin moments of a sample. In this case, the method involves providing a static magnetic field that permeates the sample and thus excites the nuclear spin moments to effect Larmor precessions. In order to detect the Larmor precessions of the nuclear spin moments, a detection spin moment with a detection region surrounding the latter is provided, wherein the detection region extends at least partly into the sample. In this case, the detection spin moment is preferably likewise situated in the magnetic field. In this case, the detection spin moment is suitably a spin moment that is different from the nuclear spin moments, for example a nuclear spin moment of a different nuclear spin species or in particular an electron spin moment. As a result, the nuclear spin moments of the sample and the detection spin moment have mutually different Larmor frequencies or resonant frequencies.

The method involves providing an antenna element, by means of which the detection spin moment and the nuclear spin moments are manipulatable. In this case, the antenna element, embodied for example as a wire or microstructured conductor track, is suitable and configured for radiating in frequency pulses for influencing the nuclear spin moments and radio-frequency pulses for influencing the detection spin moment. In this case, the frequency pulses suitably have a signal frequency corresponding to the Larmor frequency of the nuclear spin moments. When the or each frequency pulse is radiated in, the nuclear spin moments are thus excited resonantly. The radio-frequency pulses Correspondingly suitably have a signal frequency corresponding to the Larmor frequency of the detection spin moment, such that a resonant, in particular coherent, manipulation and influencing of the detection spin moment is possible.

The method comprises a polarization step, which involves polarizing at least one portion of the nuclear spin moments along the magnetic field to form a longitudinal magnetization. The magnetization or polarization of a number of nuclear spin moments should be understood hereinafter to mean in particular the ratio of the difference between two occupied alignments, for example the difference between the number of nuclear spin moments oriented parallel (equidirectionally) and anti-parallel (in an oppositely directed manner) with respect to the magnetic field, and the total number of nuclear spin moments. Preferably, in the course of the polarization step, the nuclear spin moments of the sample are polarized to equal extents within and outside the detection region. In other words, the polarization step preferably brings about a homogeneous polarization of the entire sample. This means that a comparable longitudinal magnetization is present on average in each region of the sample.

In a subsequent transfer step of the method, the longitudinal magnetization generated in the polarization step is converted into a transverse magnetization by radiating in a frequency pulse with a 90° flip angle. In other words, a resonant Tr/2 frequency pulse is radiated onto the nuclear spin moments, as a result of which the (net) alignment of the nuclear spin moments, that is to say the magnetization, is rotated from an alignment oriented along the magnetic field into a plane that is Transverse or oriented transversely with respect thereto.

A detection step of the method involves radiating in a sequence of radio-frequency pulses onto the detection spin moment and subsequently detecting a signal of the transverse magnetization present in the detection region. In other words, the Larmor-precessing transverse magnetization generates in the detection region a detectable (nuclear magnetic resonance) signal which is detectable by the detection element by means of the sequence. In this case, the signal is, in particular, a phase impressed on a Larmor precession of the detection spin moment, said precession being brought about during the sequence. In other words, by means of the sequence the detection spin moment is put into a superposition state, for example, the temporal development or dynamic range of which during the sequence is influenced by the signal of the transverse magnetization. In particular, the superposition state in this case takes up a phase brought about by the transverse magnetization, such that the signal of the transverse magnetization is detected by Reading out or detecting an end state of the detection spin moment at the end of the sequence. The detected signal is stored as a detection result in a list. In this case, the detection step is carried out a number of times repeatedly in succession, such that the list is progressively filled with successive detection results.

In this case, the method provides for the polarization step and the transfer step and also the detection steps to be carried out repeatedly until a predefined number of repetitions is reached. In this case, a new list with detection results is generated with each repetition, such that a number of lists corresponding to the number of repetitions is generated. An evaluation step of the method involves jointly evaluating the detection results of the lists across all repetitions. A particularly suitable method for generating a nuclear magnetic resonance spectrum of nuclear spin moments of a sample is realized as a result.

In contrast to the prior art, in the method according to the invention, rather than the statistical magnetization, a transverse magnetization generated in a controlled manner is detected in the detection region.

In this case, the invention is based on the insight that as a result of the polarization step and the transfer step the detected magnetization always has the same (initial) phase with respect to the sequences of the detection step. This is advantageous in particular with regard to an application in the case of liquid samples with diffusing nuclear spin moments, since substantially no influencing of the phase of the detected magnetization is thus brought about with regard to the polarized nuclear spin moments in the course of diffusing into and/or out of the detection region. In other words, a molecular diffusion of the nuclear spin moments during the method according to the invention does not bring about an undesired widening of the line widths in the nuclear magnetic resonance spectrum, as a result of which a particularly high spectral resolution is ensured.

Instead of a single long measurement time, a plurality of shorter repetitions are thus carried out, wherein the initial phase of the detected magnetization is known and identical in each repetition. As a result of the sequentially repeated measurement, the statistical information of the detection results is significantly improved, as a result of which the resolution and signal quality of the nuclear magnetic resonance spectrum generated are increased. In contrast thereto, with the prior art, on account of the randomly varying phase of the statistical magnetization, it is not possible to improve the statistics of the detection results by repetitions.

In this case, the detection results or the sequences are suitably synchronized with a local oscillator, for example a quartz crystal oscillator. In particular, the transfer step and the detection steps are synchronized with one another, such that in the repetitions a reproducible phase of the transverse magnetization is always brought about in the course of the sequences carried out repeatedly. In this case, synchronization should be understood to mean in particular temporal matching of the method steps, such that they are always carried out in a specific temporal order. In other words, with each repetition, therefore, substantially always the same nuclear magnetic resonance signal is stored in the individual lists. This means that a synchronization of the signal of the transverse magnetization and the detection thereof by means of the detection spin moment are made possible by means of the polarization and transfer steps according to the invention. As a result of the synchronization, the spectral resolution of the nuclear magnetic resonance spectrum generated is substantially limited by the stability of the oscillator.

The detected transverse magnetization has a nuclear magnetic resonance signal that oscillates with the Larmor precession of the nuclear spin moments. In this case, the nuclear magnetic resonance signal decays over the course of a (transverse) relaxation time (lifetime); that means that the amplitude of the nuclear magnetic resonance signal is reduced to zero in the course of the relaxation time. In this case, the relaxation time is a measure of the line width of the spectral resonances, that is to say of the spectral (frequency) resolution in the nuclear magnetic resonance spectrum generated. In this case, the damped oscillation signal substantially corresponds to the free induction decay signal (FID signal) in inductive nuclear magnetic resonance methods. Preferably, the detection steps in this case are carried out repeatedly for the duration of the relaxation time of the transverse magnetization, such that substantially the complete signal decay is detected during each repetition.

In this case, the relaxation time of the transverse magnetization, so-called $T_2$ relaxation, corresponds to a dephasing of nuclear spin moments of the transverse magnetization on account of entropic effects, which is associated with the magnetic dipolar interaction of adjacent nuclear spin moments. On account of inhomogeneities of the sample, it is possible in this case for a shortened relaxation time of the transverse magnetization, so-called $T_2^*$ relaxation, to be brought about. In the case of liquid samples with diffusing nuclear spin moments, only small inhomogeneites occur in the comparatively small detection region of the detection spin moment, such that the relaxation time of the detected transverse magnetization is close to $T_2$ relaxation.

In order to improve the relaxation time—and thus the spectral resolution of the nuclear magnetic resonance spectrum—it is conceivable, for example, that in the course of the transfer step a nuclear magnetic resonance sequence of frequency pulses is implemented after the frequency pulse with the 90° flip angle. By way of example, a spin echo sequence having a frequency pulse with a 180° flip angle that succeeds the frequency pulse with the 90° flip angle is conceivable, such that the $T_2$ relaxation of the transverse magnetization is measured during the detection steps.

In the prior art, the statistical magnetization is detected. The statistical magnetization has a random phase and amplitude that change randomly over a measurement time after a correlation time. Therefore, the statistical magnetization is continuously repeatedly detected during the measurement time. This means that in the prior art substantially the Fourier transformation is determined for successive correlation times and the resulting absolute values are added to the nuclear magnetic resonance spectrum. In this case, the line width of the resulting nuclear magnetic resonance spectrum is substantially limited by the comparatively short correlation time.

In contrast thereto, the method involves repeatedly detecting the relaxation of the transverse magnetization. The relaxation has, in particular in liquid samples, a significantly longer time duration than the correlation time, such that the nuclear magnetic resonance spectrum generated according to the invention enables a particularly high spectral resolution.

In one preferred embodiment, the detection spin moment is formed by an electron spin moment of a colour centre of a solid in contact with the sample. In this case, a colour centre should be understood to mean a point or lattice defect in the solid lattice of the solid, which defect absorbs optically visible light. Preferably, the detection spin moment of the colour centre is optically polarizable in this case. A suitable detection spin moment in this context is for example the electron spin moment of a nitrogen-vacancy centre (NV centre) of a diamond or nanodiamond.

The NV centre has a spin-1 electron spin moment having a ground state with zero field splitting of 2.87 GHz between a non-magnetic state ("0") and the associated magnetic states ("+1", "−1"), such that a simple manipulation by means of radiating in radio-frequency pulses in the microwave range is made possible.

In the case of illumination or irradiation with green (laser) light, the electron spin moment of the NV centre on the one hand is substantially completely polarized into the non-magnetic ground state ("0"). On the other hand, the NV centre upon excitation emits light in the red wavelength range, wherein the number of photons is dependent on the spin state of the electron spin moment before the irradiation. In other words, the state of the electron spin moment of the NV centre is optically readable by detecting the emitted photons, such that a particularly simple detection of the signal of the transverse magnetization is possible. In this case, the number of photons emitted by the NV centre and respectively detected by means of a photon detector is suitably stored as detection results. By way of example, an avalanche photodiode (APD) is used as a photon detector.

In this case, the NV centre is arranged suitably near the diamond surface, in particular at a distance of a few nanometres to micrometers, wherein the sample is in contact with the diamond surface. This ensures that the detection region of the detection spin moment extends sufficiently into the sample.

In one advantageous development, the nuclear spin moments are hyperpolarized in the polarization step in order to form the longitudinal magnetization. In this case, hyperpolarization should be understood to mean, in particular, the generation of an ordered alignment of the nuclear spin moments in the sample far beyond the thermal equilibrium distribution (equilibrium magnetization). Preferably, a polarization of the nuclear spin moments of at least 0.1%, preferably at least 1%, is brought about in this case. As a result, firstly a greater longitudinal magnetization and thus transverse magnetization are generated, as a result of which a signal-to-noise ratio of the detection results is improved. This in consequence is advantageously conveyed to the signal quality of the nuclear magnetic resonance spectra generated. Secondly, the hyperpolarization reduces the negative effect of the diffusion, that is to say the diffusing of nuclear spin moments into and/or out of the detection region during the detection step, since on average there is substantially always a constant number of nuclear spin moments of the transverse magnetization present in the detection region.

The hyperpolarization furthermore advantageously improves the sensitivity of the method, that is to say the sensitivity or the change of the detection spin moment relative to the change of the transverse magnetization, on account of the increase in the number of nuclear spin moments contributing to the transverse magnetization. In particular, it is thus possible reliably to detect even low concentrations of nuclear spin moments, for example in the millimol concentration range, in the sample and to generate a corresponding nuclear magnetic resonance spectrum. This is advantageous in particular in applications for examining metabolic processes or metabolic samples, in particular with regard to determining a metabolic fingerprint, since the sample volumes examined are often very small and of low concentration.

For hyperpolarization, a dynamic nuclear polarization (DNP) is possible, for example, in which the nuclear spin moments of the sample are caused to interact with electron spin moments. The electron spin moments have an approximately thousand-fold stronger interaction energy with the magnetic field, such that at thermal equilibrium the number of electron spin moments having ordered alignment or polarization that is established is comparatively higher than for nuclear spin moments. In other words, under otherwise identical conditions, the electron spin moments have a higher polarization or a higher degree of polarization (polarization component) than the nuclear spin moments. The (thermal) polarization of the electron spin moments is subsequently transferred to the nuclear spin moments interacting therewith. This means that after such a polarization transfer the nuclear spin moments have an ordered alignment along the magnetic field which substantially corresponds to the equilibrium distribution of the electron spin moments before the dynamic nuclear polarization. In other words, the nuclear spin moments have a (polarization) distribution that is significantly greater than the thermal equilibrium distribution of the nuclear spin moments.

In one suitable configuration, the nuclear spin moments are hyperpolarized with polarization spin moments of the solid. In one particularly preferred configuration, the nuclear spin moments are (hyper)polarized in particular by means of a polarization transfer of optically polarized NV centres. In this case, it is alternatively conceivable for the detection spin moment to be used for polarizing the nuclear spin moments. Preferably, however, additional NV centres are provided, the electron spin moments of which are used as polarization spin moments for the polarization step.

In one suitable embodiment, the sequence is generated as a decoupling sequence, in particular as a dynamical decoupling, for the detection spin moment. In this case, the sequence duration, that is to say the time duration of the entire sequence, is shorter than the relaxation time of the detection spin moment. In this case, the sequence embodied for example as a CPMG sequence (Carr-Purcell-Meiboom-Gill) or KDD sequence (Knill dynamical decoupling) acts in particular as a frequency filter for the detection spin moment. In other words, the detection spin moment is manipulated by means of the sequence during the detection step in such a way that the evolution of the spin state of the detection spin moment is able to be influenced only by specific signal frequencies from the environment. In particular, a decoupling sequence by means of which the detection spin moment is sensitive to the Larmor frequencies of the nuclear spin moments is used in this case. As a result, a reliable detection of the transverse magnetization is ensured in a simple manner.

The sequence is embodied as an XY-decoupling sequence, in which the radio-frequency pulses are generated along two pulse axes oriented perpendicularly to one another. As a result, pulse errors of the radio-frequency pulses such as, for example, inaccuracies in the phase angle and/or amplitude and/or flip angle are able to be compensated for, such that a sequence that is particularly stable and insusceptible to errors is made possible. Preferably, an X- and a Y-pulse axis are used as perpendicularly oriented pulse axes.

In this case, a pulse axis should be understood to mean, in particular, a pulse direction in a rotating reference system, that is to say a phase angle along which a frequency or radio-frequency pulse is exerted or effected. In this case, a radio-frequency pulse along an X-pulse axis is, in particular, a radio-frequency pulse which has a phase angle of 0° in the rotating reference system. Accordingly, a radio-frequency pulse along a Y-pulse axis is, in particular, a radio-frequency pulse having a (relative) phase angle of 90° with respect thereto in the rotating reference system. In this case, the Z-pulse axis is substantially always oriented along the magnetic field. In other words, the first radio-frequency pulse of the sequence substantially determines the (relative) phase angle and thus pulse direction of the subsequent radio-frequency pulses.

In this configuration, the sequence comprises as an initial pulse a radio-frequency pulse with 90° flip angle along a first pulse axis, for example the Y-pulse axis, by means of which a superposition state of the detection spin moment is generated. The sequence comprises at the end an end pulse in the form of a radio-frequency pulse with 90° flip angle along a second pulse axis, oriented perpendicularly to the first pulse axis (Y), for example a −X-pulse axis. The end pulse converts the superposition state at the end of the sequence into a population state of the spin or energy levels of the detection spin moment, which are subsequently detectable or measurable as detection result.

A number of radio-frequency pulses with 180° flip angle are arranged between the initial pulse and the end pulse. In this case, the radio-frequency pulses suitably have respectively an identical pulse spacing among one another, that is to say an identical temporal spacing between the pulses. In this case, the radio-frequency pulses are generated in the manner of an XY-decoupling sequence along two pulse axes oriented perpendicularly to one another, along the X- and Y-pulse axes. In this case, the radio-frequency pulses with 180° flip angle bring about the filter effect of the sequence, wherein the pulse spacing between radio-frequency pulses with 180° flip angle is adapted to the Larmor frequency of the nuclear spin moments. In this case, the pulse spacing is in particular equal to the inverse of double the Larmor frequency of the nuclear spin moments, that is to say that a radio-frequency pulse is radiated onto the detection spin moment after every half period duration of the Larmor precession of the nuclear spin moments or of the transverse magnetization.

During the sequence, besides the transverse magnetization, the ever present statistical magnetization in the detection region also influences the superposition state of the detection spin moment. In this case, the signal contribution of the statistical magnetization leads to an impairment of the signal-to-noise ratio and/or to a widening of the spectral lines in the nuclear magnetic resonance spectrum of the transverse magnetization. The orthogonal alignment of the end pulse with respect to the initial pulse in this case ensures that the signal contribution of the statistical magnetization is reliably averaged out, that is to say reduced or completely removed, during the common evaluation of the detection results in the evaluation step. The spectral resolution of the nuclear magnetic resonance spectrum generated is improved as a result.

In one expedient embodiment, the evaluation step involves summing or averaging the detection results of the lists across the repetitions point-by-point to form detection results of a resulting result list. The summing or averaging of the lists of the sequential repetitions firstly brings about an averaging-out of the signal contribution of the statistical magnetization, such that substantially only the signal of the transverse magnetization is present in the result list. Furthermore, the summing, in particular, effectively improves the collection or collector efficiency of each individual detection result, as a result of which the evaluation of the result list is simplified. As a result of the summing, the statistical (measurement) process during the detection of the signal in the detection step, from a process with Poisson or Bernoulli distribution, is effectively approximated to a process with binomial distribution, as a result of which the evaluation is simplified further.

In one conceivable development, the evaluation step involves autocorrelating and then Fourier-transforming the detection results of the result list. The autocorrelation describes the correlation of the list entries, that is to say of the detection results, with themselves at an earlier time. The autocorrelation thus makes it possible to establish relationships between the observed detection results at different observation times of a list (measurement series). In this case, the observation times are always identical on account of the synchronization for the different lists. The autocorrelation thus ensures that the signal contribution of the statistical magnetization is reliably removed from the signal of the transverse magnetization. As a result, in particular in the case of small numbers of repetitions, the signal quality of the result list is improved. The resulting signal formed by the detection results of the result list substantially corresponds to the damped oscillation of the nuclear magnetic resonance signal of the transverse magnetization. Fourier transformation of said signal enables a particularly suitable and high-resolution nuclear magnetic resonance spectrum to be generated in a simple manner.

In an alternative development, the evaluation step involves evaluating the detection results of the result list by means of a Bayesian inference. This means that a probability model is adapted to the detection results of the result list in such a way that a probability distribution is generated for the parameters of the model. The nuclear magnetic resonance spectrum is subsequently able to be generated on the basis of these probability distributions. A particularly suitable generation of the nuclear magnetic resonance spectrum is made possible as a result.

In one suitable development, the probability model for Bayesian inference takes account of the oscillating signal of the transverse magnetization and the photon emission of the detector spin moment and also the measuring process used for generating the detection results of the lists. Such a model for the evaluation of the result list enables a significant improvement in the efficiency of the evaluation step, as a result of which the nuclear magnetic resonance spectrum is able to be generated more rapidly and more reliably. As a result, the sensitivity of the method is improved, as a result of which nuclear magnetic resonance spectra are able to be generated for sample concentrations in the micromolar concentration range.

An additional or further aspect of the invention provides for the detection steps to be carried out simultaneously on a plurality of detection spin moments. The polarization and transfer steps ensure that, during the detection steps of the repetitions, there is substantially always an identical transverse magnetization with an identical initial phase in all detection regions of each detection spin moment. Consequently, by means of a widefield detection, for example, it is possible to carry out the detection steps simultaneously, that is to say in parallel, on a plurality of detection spin moments. In particular, in this case it is conceivable, for example, to carry out only one repetition of the polarization, transfer and detection steps and, in the evaluation step, to evaluate the number of lists corresponding to the number of detection spin moments for the generation of the nuclear magnetic resonance spectrum. The signal contribution of the statistical magnetization is likewise reduced or completely removed as a result. A particularly fast and reliable generation of the nuclear magnetic resonance spectrum is thus ensured. Furthermore, it is thus possible reliably to detect even transverse magnetizations having a comparatively small amplitude.

The device according to the invention is suitable and configured for generating a nuclear magnetic resonance spectrum of nuclear spin moments of a sample. For this purpose, the device comprises a magnet for generating a static magnetic field and a solid with at least one integrated detection spin moment. In this case, the solid is brought into contact with the sample in such a way that the detection region of the or each detection spin moment projects into the sample. The device furthermore comprises an antenna element, which comprises for example separate transmitting elements for the frequency pulses and the radio-frequency pulses. Furthermore, provision is suitably made of a sensor element, for example a photon counter or a photon detector, for detecting the signals during the detection step.

The device is suitable and configured for carrying out the above-described method according to the invention. For this purpose, the device comprises a controller (control unit), which in this case is configured generally—in terms of programming and/or circuitry—for carrying out the method described above. The controller is thus specifically configured to drive the antenna element and the sensor element in a synchronized manner by means of an integrated local oscillator in such a way that the (clock) frequency of the oscillator is effectively mixed with the detected (Larmor) frequency of the signal and detected as a modulated detection result. The controller is furthermore suitable for storing the modulated detection result of the sensor element in a memory in a list and for jointly evaluating a plurality of stored lists for the generation of the nuclear magnetic resonance spectrum in the evaluation step.

In one conceivable embodiment, the controller at least at its core is formed by a respective microcontroller with a processor and a data memory, in which the functionality for carrying out the method according to the invention is implemented in terms of programming in the form of operating software (firmware), such that the method—if appropriate in interaction with a device user—is carried out automatically upon the execution of the operating software in the microcontroller.

In the context of the invention, however, the controller can alternatively also be formed by non-programmable components, for example application-specific integrated circuits (ASICs), in which the functionality for carrying out the method according to the invention is implemented using circuitry means.

In one particularly preferred embodiment, a diamond is provided as a solid, comprising a near-surface layer of a number of "shallow" NV centres (manipulation spin moments) for the (hyper)polarization of the nuclear spin moments and a deeper layer having one or more "deep" NV centres (detection spin moments) for detection purposes. A combined polarization and detection system is formed as a result.

In this case, the shallow NV centres are suitably at a distance of a few nano-metres, in particular less than 20 nm, from the (diamond) surface. As a result of the small distance, the electron spin moments of the shallow NV centres have a strong interaction with the nuclear spin moments of the sample. The shallow layer acts as a polarization layer for the (hyper)polarization of the sample. For this purpose, the shallow NV centres are irradiated with (laser) light during the polarization step and their electron spin moments are thus optically substantially completely polarized. This polarization is subsequently transferred to the nuclear spin moments in the polarization step for example by means of a polarization sequence with a number of radio-frequency pulses.

The electron spin moments of the deep NV centres are subsequently used as detection spin moments in the detection step. The deep NV centres of this layer, also referred to hereinafter as detection layer, are suitably at a small distance, in particular less than 1 µm, from the surface. For said detection layer, in particular the statistical polarization of the nuclear spin moments in the detection region is greater than the thermal polarization thereof, for which reason hyperpolarization is particularly advantageous for the generation of the nuclear magnetic resonance spectrum.

In one advantageous development, the or each detection spin moment is arranged in the region of a nanostructuring introduced into the solid. The nanostructuring preferably has a simple geometry. In particular, so-called nanoslits, that is to say elongate, slit-like cutouts, in the surface of the solid are possible in this case. By virtue of the simple geometry, the nanostructuring is able to be produced in a simple manner and with little outlay. Preferably, an arrangement or an array of nanoslits is provided in this case. As a result, the surface area of the solid—and thus the contact area with the sample—is significantly increased. This is transferred as a consequence to the polarization step in particular in an advantageous manner, since the interaction area between the shallow NV centres and the sample is thus enlarged.

As an alternative to the nanostructuring, it is likewise conceivable, for example, to use nanoparticles, such as nanodiamonds, for example, as solids, one or more detection spin moments being arranged in each nanoparticle. In this case, the nanoparticles are mixed into the suitably liquid sample. The use of nanoparticles makes it possible, for example, to generate nuclear magnetic resonance spectra of nuclear spin moments in a living cell. Furthermore, Nuclear magnetic resonance examinations at a nanoscopic scale, such as chemical reactions within a battery, for example, are thus possible.

BRIEF DESCRIPTION OF THE DRAWINGS

Exemplary embodiments of the invention are explained in greater detail below with reference to a drawing, in which in simplified and schematic illustrations.

DETAILED DESCRIPTION OF THE INVENTION

Mutually corresponding parts and variables are always provided with the same reference signs in all the figures.

Figure 1:
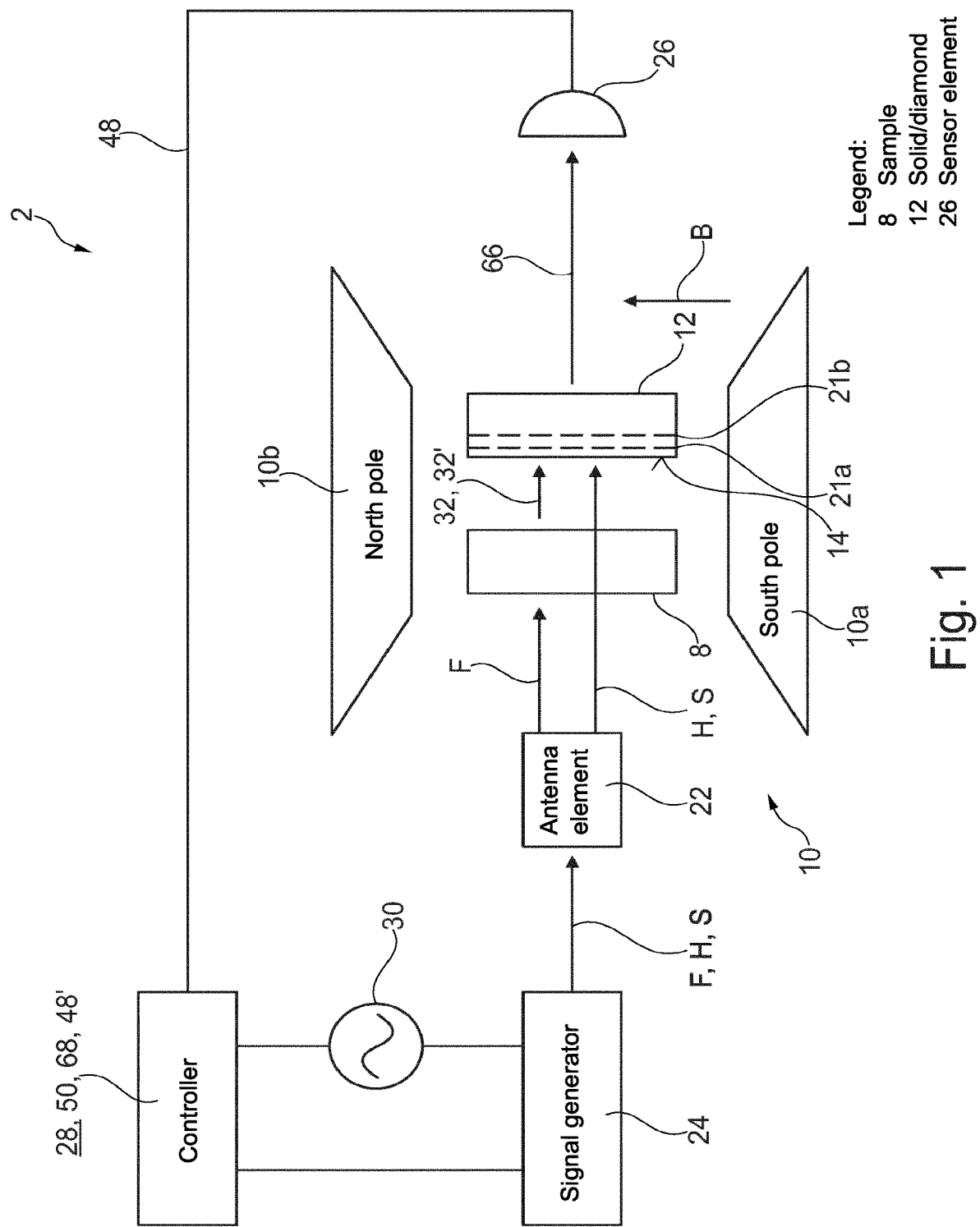
FIG. 1 shows a device for generating a nuclear magnetic resonance spectrum of nuclear spin moments of a sample.

The device 2 illustrated in FIG. 1 is suitable and configured for generating a nuclear magnetic resonance spectrum 4 (FIG. 8) of nuclear spin moments 6 (FIG. 2a, FIG. 2b) of a sample 8. The device 2 comprises a magnet 10, having a north pole 10a and a south pole 10b, between which a homogeneous magnetic field B is generated during operation. During operation, the sample 8 together with a solid 12 is positioned for example in a region of the magnet 10 that is freed between the north pole 10a and south pole 10b.

The sample 8 is a liquid material sample, for example, which is applied on the surface 14 of the solid 12. As illustrated schematically and in a simplified manner in FIG. 2a and FIG. 2b, the sample 8 has a number of nuclear spin moments 6. The nuclear spin moments 6 are provided with reference signs merely by way of example in FIGS. 2a and 2b. The solid 12 has near the surface 14 at least one detection spin moment 16 and at least one polarization spin moment 17. The detection spin moment 16 has a detection region 18, which extends into the sample 8.

Figure 9:
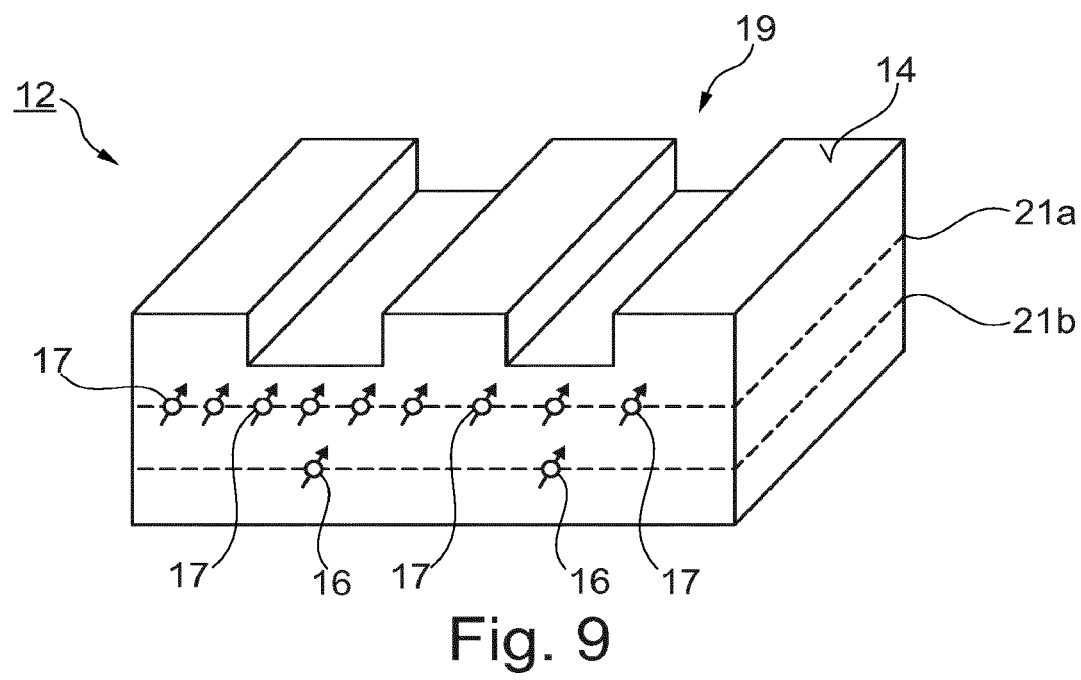
FIG. 9 shows a diamond with a nanostructuring and a number of Detection spin moments and polarization spin moments.

The solid 12 is embodied as a diamond with a number of nanoslits, which are shown merely by way of example in FIG. 9 and which are introduced as nanostructuring 19 into the surface 14 of the solid 12. The detection spin moments 16 and polarization spin moments 17 here are preferably embodied in each case as an electron spin moment of a colour centre, in particular of an NV centre. The detection spin moment 16 and the polarization spin moment 17 are polarizable with a laser light 20 of a laser (not shown) along a polarization axis, which is oriented for example parallel to the magnetic field B in FIGS. 2a and 2b.

In this case, the solid 12 substantially comprises two layers 21a, 21 b, in each of which a number of NV centres are arranged (FIG. 9). The layers 21a, 21 b in this case are at different distances from the surface 14 of the diamond 12.

The layer 21a, also referred to hereinafter as polarization layer, is at a small distance from the surface 14, in particular approximately 20 nm. A number of NV centres are arranged in the polarization layer 21a, the electron spin moments of which NV centres are used as polarization spin moments 17 for the hyperpolarization of the nuclear spin moments 6 of the sample 8.

Those NV centres whose electron spin moments act as detection spin moments 16 are arranged in the layer 21b arranged at a distance from the polarization layer 21a. In this case, the layer 21b, also referred to hereinafter as detection layer, is at a distance for example of approximately 1 μm from the surface 14.

For exciting and influencing the nuclear spin moments 6 of the sample 8 and also the detection spin moments 16 and polarization spin moments 17 of the solid 12, the device 2 comprises an antenna element 22. The antenna element 22 is coupled to a signal generator 24. During operation, the signal generator 24 is suitable and configured to generate frequency pulses F and radio-frequency pulses H (FIG. 4) having a specific frequency, pulse duration, pulse amplitude and pulse phase angle. The generated frequency pulses F and radio-frequency pulses H are radiated onto the sample 8 and the solid 12 by means of the antenna element 22.

In this case, the frequency pulses F suitably have a signal frequency that corresponds to a Larmor frequency of the nuclear spin moments 6 in the magnetic field B. In this case, the frequency pulses F have for example a signal frequency in the radio-frequency range, in particular in a kHz to MHz range. The radio-frequency pulses H correspondingly suitably have a signal frequency corresponding to the Larmor frequency of the detection spin moment 16 and of the polarization spin moments 17, respectively, such that a resonant, in particular coherent, manipulation and influencing of the detection spin moment 16 is brought about. In this case, the signal frequency of the radio-frequency pulses H is preferably in the microwave range, in particular in an MHz to GHz range. In this case, the Larmor frequencies of the nuclear spin moments 6 and of the detection spin moment 16 are suitably different from one another, such that upon an irradiation the frequency pulses F have an influencing effect only on the nuclear spin moments 6 of the sample 8 and the radio-frequency pulses H have an influencing effect only on the detection spin moment 16.

The device 2 comprises a sensor element 26, in particular an avalanche photodiode, which is connected in terms of signaling to a controller 28. The controller 28 and the signal generator 24 are coupled to a local oscillator 30, for example a quartz crystal. The oscillator 30 generates a clock frequency fro, by means of which the controller 28 and/or the signal generator 24 are operated jointly in a synchronized manner.

Figure 2A:
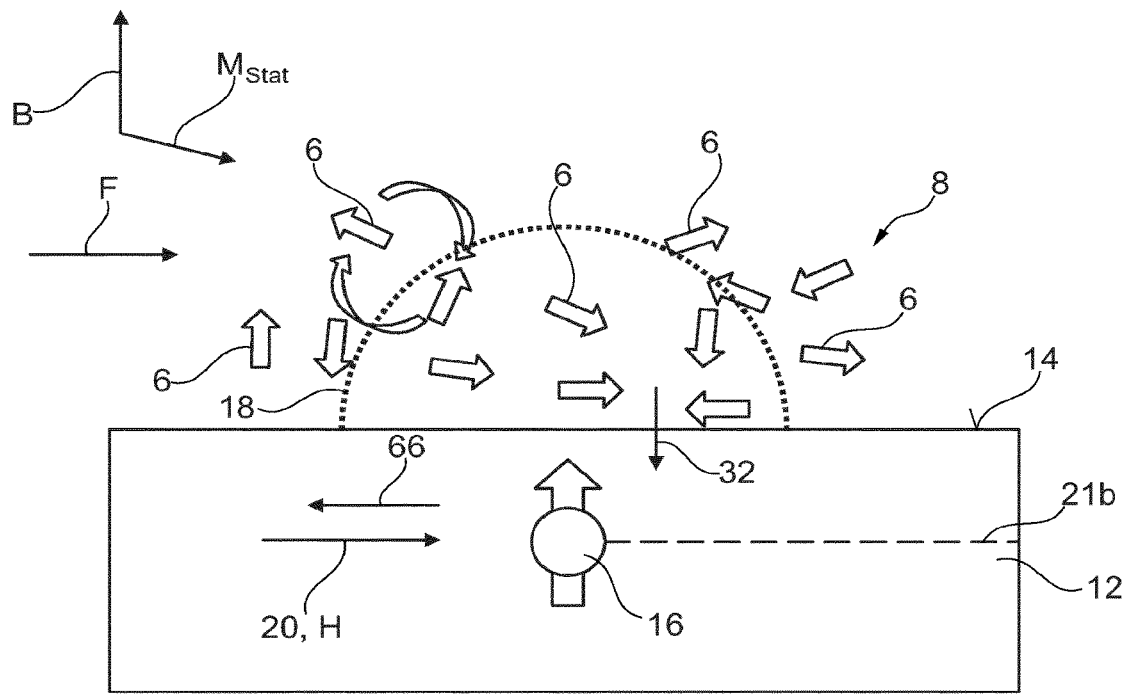
FIG. 2a shows a detection spin moment with a detection region permeating the sample in an unpolarized state of the sample.

The solid 12 and the sample 8 are shown schematically and in a simplified manner in FIG. 2a. In this case, the nuclear spin moments 6 are for example part of a respective molecule that diffuses (molecularly) in the sample 8. The detection spin moment 16 is arranged near the surface 14, in particular less than 1 μm below the surface 14, within the detection layer 21 b. The polarization layer 21 a having the polarization spin moments 17 suitable for hyperpolarization is not shown in FIGS. 2a and 2b.

The nuclear spin moments 6 have in the detection region 18 a statistical magnetization $M_{stat}$, that is to say a random net alignment of the nuclear spin moments 6. The magnetization $M_{stat}$ undergoes Larmor precession about the magnetic field B and thus generates an alternating magnetic field as (nuclear magnetic resonance) signal 32, which is detectable by means of the detection spin moment 16.

The magnetization $M_{stat}$ has a random (net) phase in this case on account of the substantially randomly oriented nuclear spin moments 6. On account of the molecular diffusion, which is illustrated by way of example with curved arrows in the figures, during a correlation time nuclear spin moments 6 diffuse out of and/or into the detection region 18. As a result, the amplitude and phase of the magnetization $M_{stat}$ are changed randomly, as a result of which the signal 32 is influenced. This makes it more difficult to generate a nuclear magnetic resonance spectrum with high spectral resolution.

Figure 3:
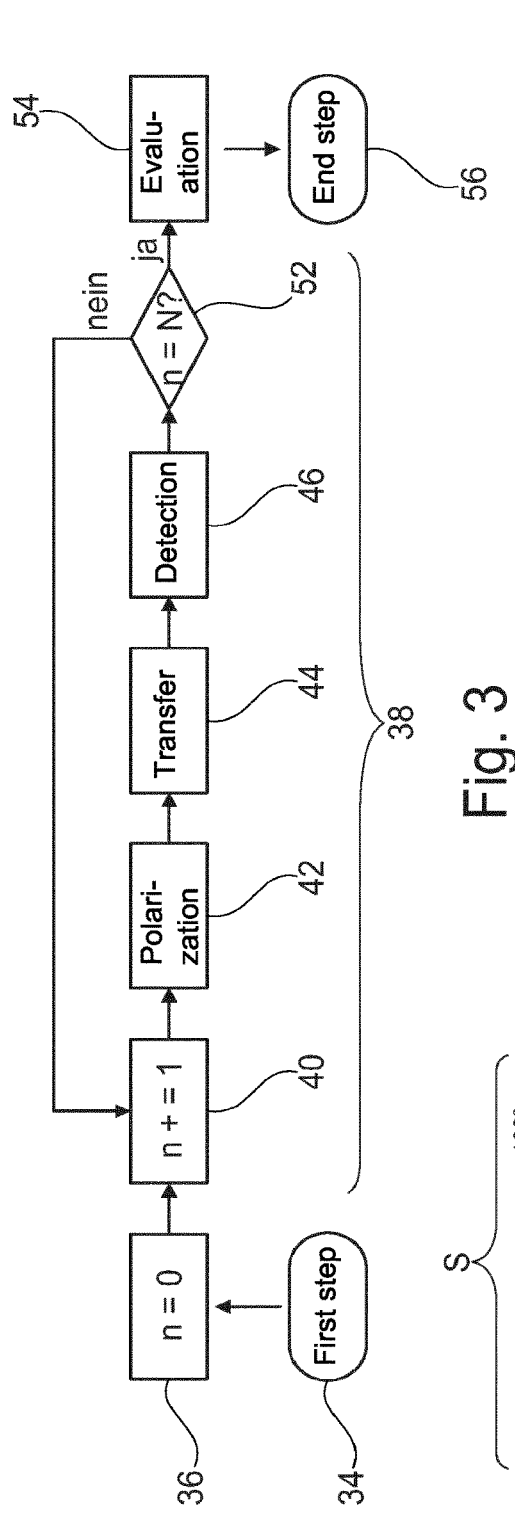
FIG. 3 shows a flow diagram of a method for generating a nuclear magnetic resonance spectrum of nuclear spin moments of a sample.

FIG. 3 shows a method for generating the nuclear magnetic resonance spectrum 4. The method is started in a first method step 34 and, in a subsequent method step 36, a count n is set to zero. Afterwards, a measurement sequence 38 is started.

In a method step 40 of the measurement sequence 38, the count n is increased by one. A subsequent polarization step 42 involves polarizing at least one portion of the nuclear spin moments 6 of the sample 8 along the magnetic field B to form a longitudinal magnetization $M_z$. In this case, the nuclear spin moments 6 are preferably hyperpolarized, such that for example at least 0.1%, in particular at least 1%, of the nuclear spin moments 6 of the sample 8 are oriented in an identical way.

In the polarization step 42, the NV centres of the polarization layer 21a are optically polarized with the laser light 20; that is to say that the electron or polarization spin moments 17 thereof are prepared into a defined (spin) state. The resulting polarization of the polarization spin moments 17 is transferred from the polarization spin moments 17 to the nuclear spin moments 6 by means of a polarization sequence (not shown in more specific detail) by irradiation with a number of radio frequency pulses H. The substeps of the optical polarization and the subsequent polarization transfer are carried out in a manner repeated a number of times, for example, in order to bring about a higher polarization of the nuclear spin moments 6.

A subsequent transfer step 44 of the method involves converting the longitudinal magnetization $M_z$ generated in the polarization step 42 into a transverse magnetization $M_{xy}$ by radiating in a frequency pulse F with a 90° flip angle.

A detection step 46 of the method involves radiating in a sequence S (FIG. 4) of radio-frequency pulses H onto the detection spin moment 16 and subsequently detecting a signal 32' of the transverse magnetization $M_{xy}$ present in the detection region. The detected signal 32' is detected by means of the sensor element 26 and stored as a detection result 48 in a list 50 in a memory of the controller 28. In this case, the detection step 46 is carried out a number of times repeatedly in succession, such that the list 50 is progressively filled with successive detection results 48. By way of example, just one detection step 46 is illustrated in FIG. 3.

Figure 2B:
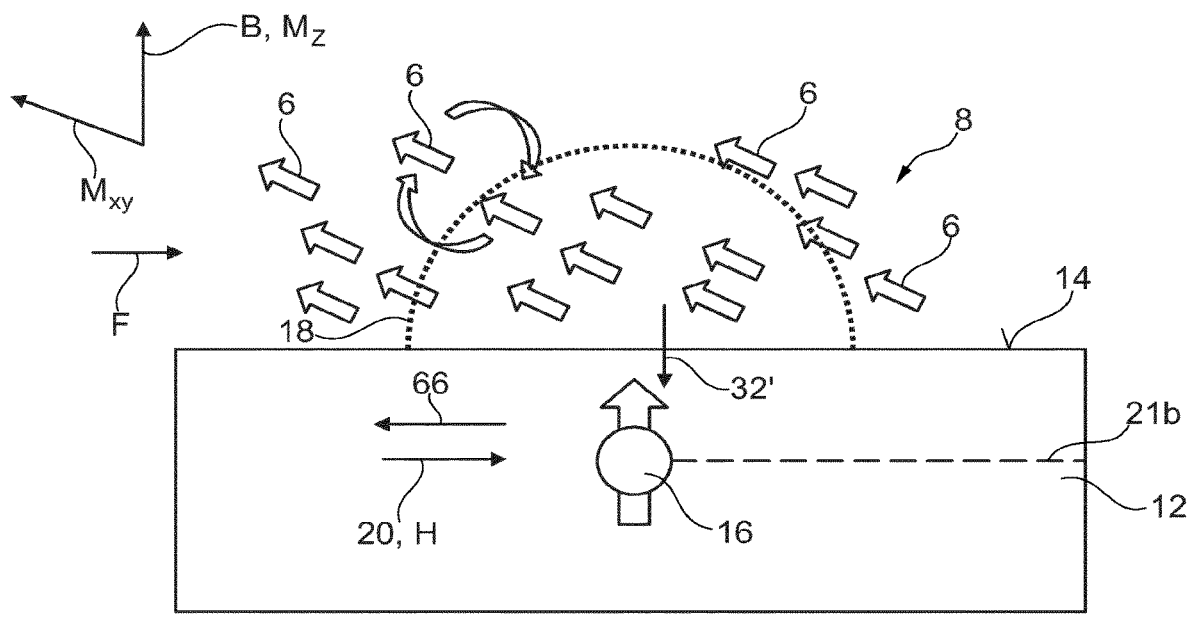
FIG. 2b shows the detection spin moment with the detection region in a fully polarized state of the sample.

The effect of the polarization step 42 and of the transfer step 44 is shown for a 100% polarization of the nuclear spin moments 6 in FIG. 2b. Generating the longitudinal magnetization $M_z$ and converting it into the transverse magnetization $M_{xy}$ ensures that substantially no influencing of the phase and/or of the amplitude of the transverse magnetization $M_{xy}$ is effected even in the case of a diffusion of the nuclear spin moments 6. In other words, the detectable signal 32' is substantially not influenced by the diffusion within the sample 8.

At the end of the measurement sequence 38, the count n is compared with a predefined or predefinable number of repetitions N in a comparison 52. In the case of a negative comparison result, in which the count n is less than the desired number of repetitions N, the measurement sequence 38 is carried out repeatedly, wherein at the beginning of the measurement sequence 38 a new list 50 is generated for the new detection results 48.

In the case of a positive comparison result of the comparison 52, in which the count n is equal to the desired number of sequential repetitions N, the measurement sequence 38 is ended and an evaluation step 54 of the method is started. The evaluation step 54 involves jointly evaluating the detection results 48 of the lists 50 across all repetitions N and generating the nuclear magnetic resonance spectrum 4. Finally, the method is ended with a method step 56.

Figure 4:
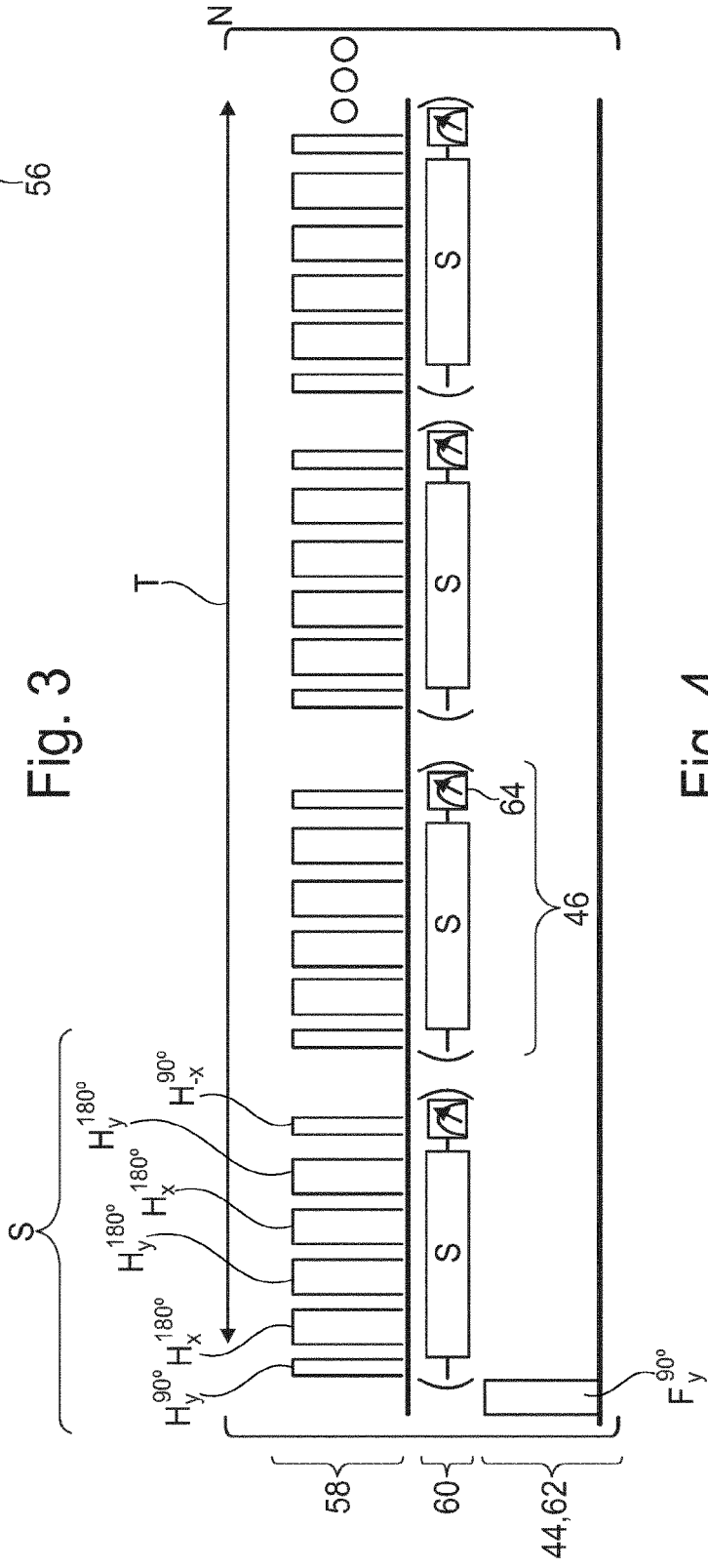
FIG. 4 shows a measurement protocol according to the method.

The measurement sequence 38 is explained in greater detail below with reference to FIG. 4. The polarization step 42 is not illustrated in FIG. 4. The illustration in FIG. 4 has substantially three sections 58, 60, 62. In sections 58 and 62, frequency pulses F and radio-frequency pulses H are illustrated in a block like manner, wherein the pulses F, H hereinafter are provided with a subscripted index for describing a pulse axis X, Y and with a superscripted index for describing the respective flip angle (90°, 180°).

Section 62 substantially illustrates the transfer step 44. In this exemplary embodiment, the longitudinal magnetization $M_z$ is converted into the transverse magnetization $M_{xy}$ by means of a frequency pulse $F_y^{90°}$, that is to say a frequency pulse F with 90° flip angle along the Y-pulse axis. In this case, the transverse magnetization $M_{xy}$ decays during a relaxation time T. This means that the signal 32' is substantially a damped oscillation having an oscillation frequency equal to the Larmor frequency of the transverse magnetization $M_{xy}$, wherein the decay constant or decay time is equal to the relaxation time T. In this case, the relaxation time T is in particular equal to a transverse relaxation time of the nuclear spin moments 6 in the sample 8, for example equal to a $T_2^*$ or $T_2$ relaxation.

The detection steps 46 carried out repeatedly are shown schematically and in a simplified manner in section 60. The detection steps 46 in this case substantially comprise the sequence S and also a read-out step 64. In the read-out step 64, the sensor element 26 generates the detection results 48. Preferably, the detection steps 46 are in this case carried out repeatedly during the relaxation time T, such that substantially the complete signal decay of the signal 32' is detected.

Section 58 shows one exemplary embodiment of the sequences S. In this case, the sequence S is embodied as a decoupling sequence, in particular an XY-decoupling sequence. In the exemplary embodiment in FIG. 4, the sequence S is embodied in particular as an XY4-sequence. In this configuration, the sequence S comprises as initial pulse a radio-frequency pulse $H_y^{90°}$, by means of which the detection spin moment 16 is put into a (transverse) superposition state. In this state, the detection spin moment 16 precesses at its Larmor frequency about the magnetic field B, wherein the signal 32' influences the detection spin moment 16 on account of dipolar interactions.

In order to improve the sensitivity of the detection spin moment 16 to the signal 32', the sequence S comprises four successive radio-frequency pulses $H_x^{180°}$, $H_y^{180°}$, $H_x^{180°}$ and $H_y^{180°}$. The radio-frequency pulses $H_x^{180°}$, $H_y^{180°}$, $H_x^{180°}$, $H_y^{180°}$ are spaced apart equidistantly from one another and each bring about a refocusing of the temporal development of the detection spin moment 16, as a result of which the radio-frequency pulses $H_x^{180°}$, $H_y^{180°}$, $H_x^{180°}$, $H_y^{180°}$ act as an effective frequency filter for the detection spin moment 16. In this case, the pulse spacings between the radio-frequency pulses $H_x^{180°}$, $H_y^{180°}$, $H_x^{180°}$, $H_y^{180°}$ are in particular equal to half a Larmor period of the precessing transverse magnetization $M_{xy}$, as a result of which the phase brought about by the signal 32' between the radio-frequency pulses $H_x^{180°}$, $H_y^{180°}$, $H_x^{180°}$, $H_y^{180°}$ is effectively summed across the sequence S.

The sequence S comprises at the end an end pulse in the form of a radio-frequency pulse $H_{-x}^{90°}$. The radio-frequency pulse $H_{-x}^{90°}$ converts the superposition state of the detection spin moment 16 at the end of the sequence S into a population state of the spin or energy levels of the detection spin moment 16. In this case, the phase brought about by the signal 32' is converted into a corresponding population difference of said energy levels, which is detected by means of the read-out step 64.

The detection spin moment 16 is, in particular, an electron spin moment of an NV centre. In the read-out step 64, the detection spin moment 16 is irradiated with the, in particular green, laser light 20. As a result, depending on the population state at the end of the sequence S the detection spin moment 16 on the one hand emits photons 66 in the red wavelength range. On the other hand, the state of the detection spin moment 16 is thereby optically polarized, that is to say put into an initial state, such that the subsequent detection step 46 can be started directly thereafter. The emitted photons 66 are detected by the sensor element 26, wherein a corresponding photon number or photon counting rate is stored as detection result 48 in the respective list 50.

By virtue of the clock frequency fro of the oscillator and the controller 28 and signal generator 24 synchronized therewith, the individual method steps 40, 42, 44 and 52 of the measurement sequence 38 are carried out in a manner synchronized with one another. As a result, the signal 32' is always measurable reproducibly during successive repetitions. In particular, the repeatedly performed detection steps 46 substantially correspond to discrete time steps at which the temporal development of the signal 32' is detected. In this case, the detection results 48 are synchronized upon storage in the respective list 50, that is to say are provided with an additional time value, for example.

Figure 5:
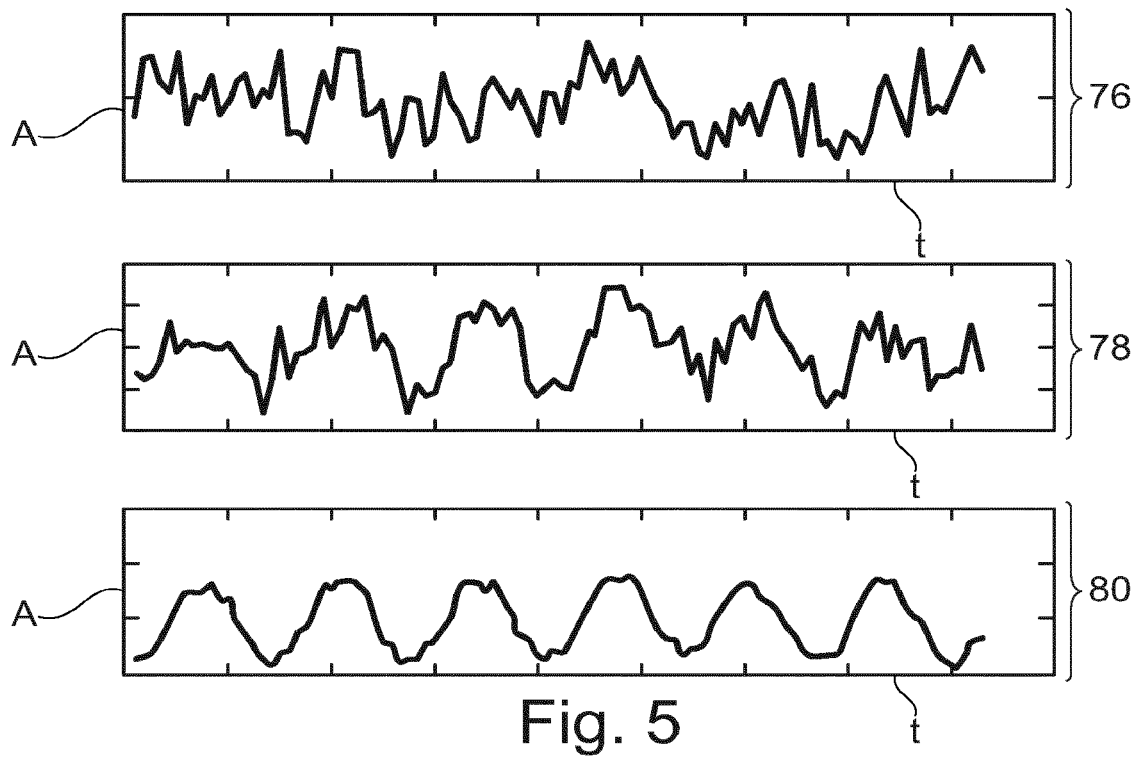
FIG. 5 shows an averaged nuclear magnetic resonance signal for different numbers of repetitions of the measurement protocol.
Figure 6:
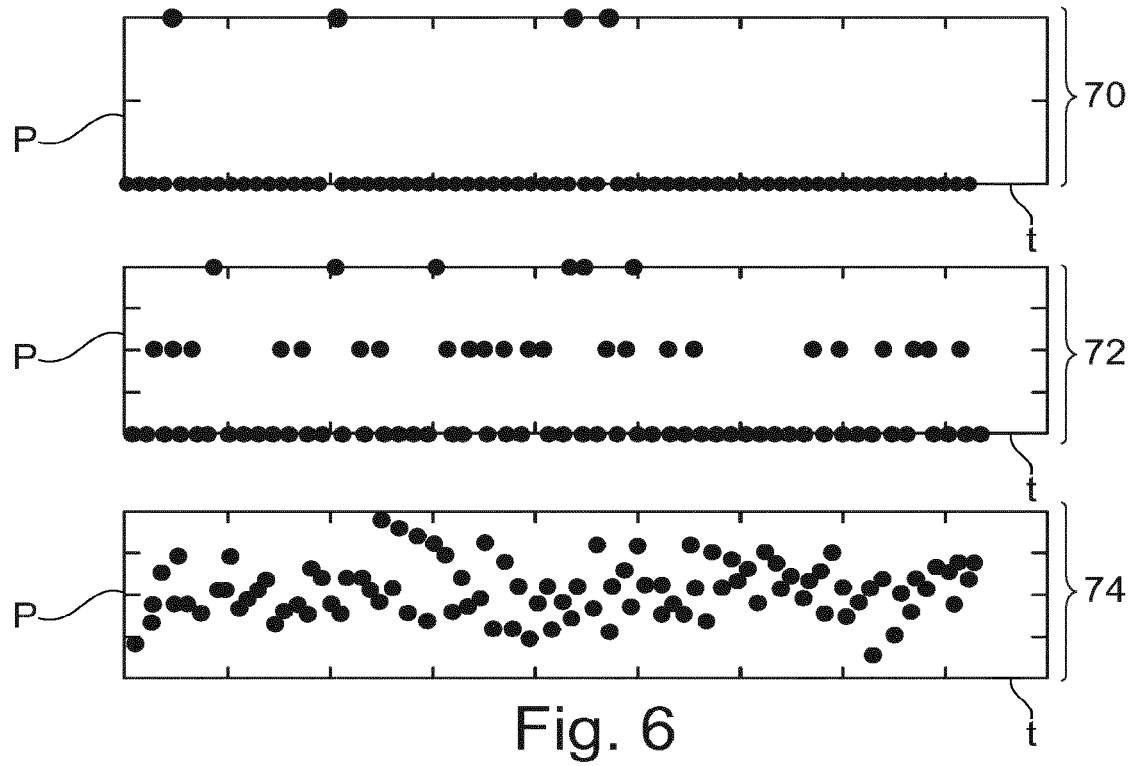
FIG. 6 shows an averaged photon detection for different numbers of repetitions of the measurement protocol.
Figure 7:
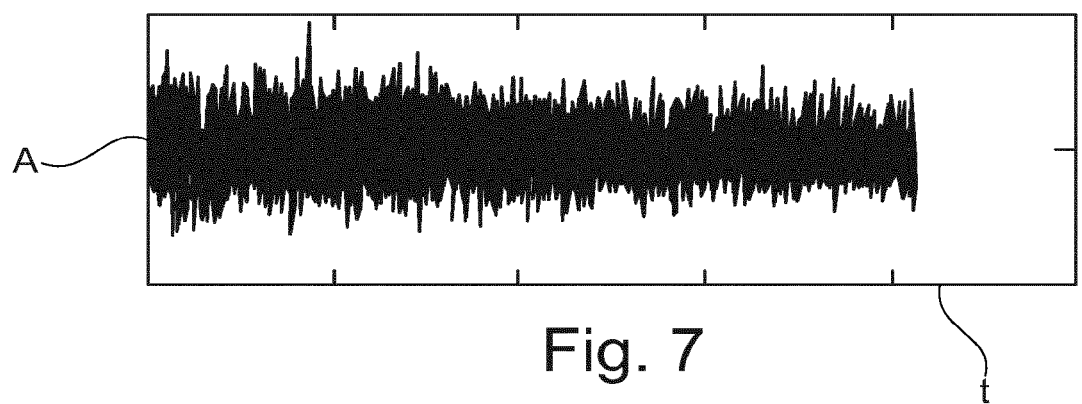
FIG. 7 shows an averaged nuclear magnetic resonance signal for 100 repetitions.
Figure 8:
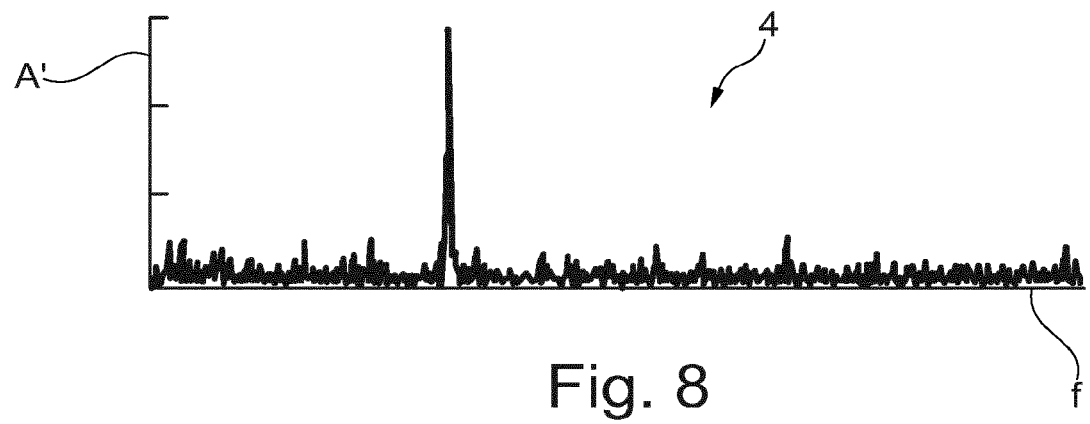
FIG. 8 shows a nuclear magnetic resonance spectrum of the nuclear magnetic resonance signal according to FIG. 7.

The lists 50 of the repetitions N of the measurement sequence 38 are evaluated jointly in the evaluation step 54. The evaluation step 54 is explained in greater detail below on the basis of the exemplary embodiments in FIGS. 5 to 8. The exemplary embodiments in FIG. 5 and FIG. 6 show the signal profiles in which approximately 0.1% of the nuclear spin moments 6 is polarized in the polarization step 42. FIGS. 7 and 8 show exemplary embodiments in the case of a 1% polarization of the nuclear spin moments 6.

The evaluation step 54 involves summing the detection results 48 of the lists 50 across the repetitions N point-by-point to form a resulting result list 68. The entries or summed detection results 48' of the result list 68 are subsequently autocorrelated.

FIG. 6 has three sections 70, 72, 74. The sections 70, 72, 74 in each case show the entries of the result list 68 for different numbers of repetitions N. A time t resulting from the synchronization of the oscillator 30 is plotted along the respective x-axis or abscissa axis. The respective photon number P is shown along the y-axis or ordinate axis. The summed detection results 48' of the respective result list 68 are represented as dots.

FIG. 5 shows, in three sections 76, 78 and 80, the autocorrelated signal data of the corresponding result lists 68 in the sections 70, 72 and 74. In this case, the autocorrelated signal data substantially correspond to the signal 32' of the transverse magnetization $M_{xy}$. Time t is plotted along the respective x-axis or abscissa axis. The respective signal amplitude A is shown along the y-axis or ordinate axis.

The section 70 shows the detection results 48' of a result list 68 for a single repetition N of the measurement sequence 38, that is to say that N=1. The correspondingly autocorrelated signal data of the detection results 48' are illustrated in the section 76. On account of a limited collector efficiency of the sensor element 26, photons 66 are only occasionally detected during the read-out step 64 of the detection steps 46. The autocorrelated signal of the section 76 has a correspondingly poor signal-to-noise ratio.

The polarization step 42 and the transfer step 44 ensure that the transverse magnetization $M_{xy}$ always has the same initial phase during the measurement sequence 38. As a result, the same signal 32' is always measured during the sequential repetitions N; this means that the detection results 48 of the lists 50 are detected at identical times of the temporal development of the signal 32'. As the number of repetitions N increases, the point-by-point summing of the detection results 48 to form the detection results 48' thus brings about an improved signal-to-noise ratio. By way of example, sections 72 and 78 show the results of a result list 68 for one hundred repetitions N (N=100) and sections 74 and 80 show the results of a result list 68 for three hundred repetitions N (N=300). The predefined number of repetitions N thus determines the resulting signal quality.

In the evaluation step 54, the autocorrelated data of the result list 68 are Fourier-transformed. In this case, the absolute value of the Fourier-transformed data forms the nuclear magnetic resonance spectrum 4 generated.

FIG. 7 shows the autocorrelated signal data of a result list 68 for a 1% polarization of the nuclear spin moments 6 and one hundred repetitions N (N=100) of the measurement sequence 38 for the entire relaxation time T. Time t is shown along the x-axis or abscissa axis and the signal amplitude A is shown along the y-axis or ordinate axis.

FIG. 8 shows the data—generated by means of a fast Fourier transformation (FFT)—of the autocorrelated signal data of the result list 68 in accordance with FIG. 7. The frequency f is shown along the x-axis or abscissa axis and the signal amplitude A' of the nuclear magnetic resonance spectrum 4 generated is shown along the y-axis or ordinate axis.

The invention is not restricted to the exemplary embodiments described above. Rather, other variants of the invention can also be derived therefrom by the person skilled in the art, without departing from the subject matter of the invention. In particular, all individual features described in association with the exemplary embodiments are furthermore also able to be combined with one another in a different way, without departing from the subject matter of the invention.

In this regard, it is conceivable, for example, to carry out the detection steps 46 simultaneously or in parallel on a plurality of detection spin moments 16, for example in the course of a common widefield detection.

Furthermore, it is possible for the detection results 48' of the result list 68 to be evaluated by means of Bayesian inference in the evaluation step 54 for the generation of the nuclear magnetic resonance spectrum 4.

LIST OF REFERENCE SIGNS

2 Device
4 Nuclear magnetic resonance spectrum
6 Nuclear spin moment
8 Sample
10 Magnet
10a North pole 10b South pole
12 Solid/diamond
14 Surface
16 Detection spin moment
17 Polarization spin moment
18 Detection region
19 Nanostructuring
20 Laser light
21a Layer/polarization layer
21 b Layer/detection layer
22 Antenna element
24 Signal generator
26 Sensor element
28 Controller
30 Oscillator
32, 32' Signal
34,36 Method step
38 Measurement sequence
40 Method step
42 Polarization step
44 Transfer step
46 Detection step
48, 48' Detection result
50 List
52 Comparison
RadioMag54 Evaluation step
56 Method step
58, 60, 62 Section
64 Read-out step
5 66 Photon
68 Result list
70, 72, 74 Section
76, 78, 80 Section
B Magnetic field
F Frequency pulse
H Radio-frequency pulse
$f_{LO}$ Clock frequency
$M_{stat}$ Magnetization
n Count
$M_z$ Longitudinal magnetization
$M_{xy}$ Transverse
S Sequence
X, Y Pulse axis
N Repetition
T Relaxation time
A, A' Signal amplitude
t Time
P Photon number
P f Frequency

The invention claimed is:

1. A method for generating a nuclear magnetic resonance spectrum of nuclear spin moments of a sample, using a static magnetic field permeating the sample, a detection spin moment which is an electron spin moment, said detection spin moment having a detection region surrounding the sample, and said detection region extending at least partly into the sample, and also an antenna element for radiating in frequency pulses for influencing the nuclear spin moments and radio-frequency pulses for influencing the detection spin moment, the method comprising:
 a polarization operation including polarizing a portion of the nuclear spin moments along the magnetic field to form a longitudinal magnetization, the portion being at least 1% of the nuclear spin moments;
 a transfer operation including converting the longitudinal magnetization into a transverse magnetization by radiating in a frequency pulse;
 a detection operation including:
  radiating a sequence of radiofrequency pulses onto the detection spin moment,
  detecting a signal of the transverse magnetization present in the detection region, storing the detected signal as detection result, and
  wherein the detection operation is carried out a number of times repeatedly in succession;
 wherein the polarization operation, the transfer operation, and the detection operations are carried out repeatedly until a predefined number of repetitions is reached;
 wherein the detection results are stored with each repetition; and
 an evaluation operation including jointly evaluating the detection results across all repetitions.

2. The method of claim 1, wherein the detection spin moment is formed by an electron spin moment of a color center of a solid in contact with the sample.

3. The method of claim 1, wherein the nuclear spin moments are polarized with polarization spin moments of the solid.

4. The method of claim 1, wherein the sequence comprises a decoupling sequence for the detection spin moment.

5. The method of claim 4, wherein the decoupling sequence comprises:
 a first radio-frequency pulse configured to induce a 90° nuclear spin moment flip along a first pulse axis;
 a second radio-frequency pulse configured to induce a 90° nuclear spin moment flip along a second pulse axis, the second pulse axis oriented perpendicularly to the first pulse axis; and
 a number of third radio-frequency pulses, the third radio-frequency pulses provided between the first radio-frequency pulse and the second radio-frequency pulse, each of the third radio-frequency pulses configured to induce a 180° nuclear spin moment flip along one of two pulse axes oriented perpendicularly to one another; and
 wherein one or more pulse spacings between the first, second, and third radiofrequency pulses are adapted to a precession frequency of the nuclear spin moments in the magnetic field.

6. The method of claim 1, wherein the evaluation operation includes summing or averaging the detection results across the repetitions point-by-point to generate second detection results.

7. The method of claim 6, wherein the evaluation operation includes autocorrelating and Fourier-transforming the second detection results.

8. The method of claim 6, wherein the evaluation operation includes updating the second detection results using Bayesian inference.

9. The method of claim 1, wherein each detection operation includes detection of signals corresponding to multiple differing detection spin moments.

10. The device of claim 1, wherein the detection spin moment is formed by an electron spin moment of a color center of a solid in contact with the sample.

11. A device for generating a nuclear magnetic resonance spectrum of nuclear spin moments of a sample, the device comprising:
 a magnet for generating a static magnetic field;
 a solid with at least one integrated detection spin moment which is an electron spin moment;
 an antenna element; and
 a controller configured to cause the device to perform operations including:

a polarization operation including polarizing at least one portion of the nuclear spin moments along the magnetic field to form a longitudinal magnetization, the portion being at least 1% of the nuclear spin moments;

a transfer operation including converting the longitudinal magnetization into a transverse magnetization by radiating in a frequency pulse;

a detection operation including:
- radiating a sequence of radiofrequency pulses onto the detection spin moment,
- detecting a signal of the transverse magnetization present in the detection region,
- storing the detected signal as detection result, and
- wherein the detection operation is carried out a number of times repeatedly in succession;

wherein the polarization operation, the transfer operation, and the detection operations are carried out repeatedly until a predefined number of repetitions is reached;

wherein the detection results are stored with each repetition; and an evaluation operation including jointly evaluating the detection results across all repetitions.

12. The device of claim 11, wherein the or each the detection spin moment is arranged in the region of a nanostructuring introduced into the solid.

13. The device of claim 11, wherein the nuclear spin moments are polarized with polarization spin moments of the solid.

14. The device of claim 11, wherein the sequence comprises a decoupling sequence for the detection spin moment.

15. The device of claim 14, wherein the decoupling sequence comprises:

a first radio-frequency pulse configured to induce a 90° nuclear spin moment flip along a first pulse axis;

a second radio-frequency pulse configured to induce a 90° nuclear spin moment flip along a second pulse axis, the second pulse axis oriented perpendicularly to the first pulse axis; and a number of third radio-frequency pulses, the third radio-frequency pulses provided between the first radio-frequency pulse and the second radio-frequency pulse, each of the third radio-frequency pulses configured to induce a 180° nuclear spin moment flip along one of two pulse axes oriented perpendicularly to one another; and wherein one or more pulse spacings between the first, second, and third radiofrequency pulses are adapted to a precession frequency of the nuclear spin moments in the magnetic field.

16. The device of claim 11, wherein the evaluation operation includes summing or averaging the detection results across the repetitions point-by-point to generate second detection results.

17. The device of claim 16, wherein the evaluation operation includes autocorrelating and Fourier-transforming the second detection results.

18. The device of claim 16, wherein the evaluation operation includes updating the second detection results using Bayesian inference.

19. The device of claim 11, wherein each detection operation includes detection of signals corresponding to multiple differing detection spin moments.

* * * * *